United States Patent
Yuan (10) Patent No.: US 8,482,980 B2
(45) Date of Patent: Jul. 9, 2013

(54) MEMORY ARRAY AND METHOD OF OPERATING THE SAME

(75) Inventor: Qing Peng Yuan, Shanghai (CN)

(73) Assignee: Giantec Semiconductor Ltd. Inc., Shanghai (CN)

( * ) Notice: Subject to any disclaimer, the term of this patent is extended or adjusted under 35 U.S.C. 154(b) by 212 days.

(21) Appl. No.: 13/206,643

(22) Filed: Aug. 10, 2011

(65) Prior Publication Data

US 2013/0021850 A1    Jan. 24, 2013

(51) Int. Cl.
*G11C 16/04* (2006.01)
(52) U.S. Cl.
USPC ............. 365/185.05; 365/185.29; 365/185.11
(58) Field of Classification Search
USPC .................... 365/185.05, 185.29, 185.11
See application file for complete search history.

(56) References Cited

U.S. PATENT DOCUMENTS

2007/0133341 A1*   6/2007   Lee et al. ................... 365/238.5
2011/0157972 A1*   6/2011   Pasotti et al. .............. 365/185.1

* cited by examiner

*Primary Examiner* — Tuan T. Nguyen
(74) *Attorney, Agent, or Firm* — Yuan Qing Jianq (57) ABSTRACT

A memory device comprises at least one memory array on a semiconductor substrate. Each said memory array comprises a page control line and a plurality of pages, each said page is arranged in a row comprising a plurality of bytes which couple to a page control transistor with its drain terminal connected to the page control line. Each said byte includes at least one memory cell. Said memory array further comprises a plurality of source control devices which are configured to provide either predetermined biases or floating potentials to source lines, each said source line couples to all the bytes on the same byte segment of the memory array. Read, erase, and program methods are provided to operate said memory devices in byte addressable fashion.

11 Claims, 9 Drawing Sheets

ERASE OPERATION 700

| PAGE CONTROL LINE 300 | GATE OF SOURCE CONTROL 390 | SELECTED WORD LINE | NON-SELECTED WORD LINES | SELECTED BIT LINES | NON-SELECTED BIT LINES |
|---|---|---|---|---|---|
| On Voltage | Off Voltage | On Voltage | Off Voltage | Off Voltage | On Voltage |

FIG. 7A

| Byte | Array Node Potential | | | | Cell Node Potential | | |
|---|---|---|---|---|---|---|---|
| | PCL | WL | BL | SCL | CG (520) | CD (540) | CS (530) |
| 410-450 | HV | HV | 0 | 0 | HV | 0 | Float (0) |
| 420-450 | HV | HV | HV | 0 | HV | HV | Float (HV) |
| 420-460 | HV | 0 | HV | 0 | Float | Float | Float (HV) |
| 410-460 | HV | 0 | 0 | 0 | Float | Float | Float (0) |

FIG. 7B

PROGRAM OPERATION

| PAGE CONTROL LINE 300 | GATE OF SOURCE CONTROL 390 | SELECTED WORD LINE | NON-SELECTED WORD LINES | SELECTED BIT LINES | NON-SELECTED BIT LINES |
|---|---|---|---|---|---|
| Ground | Off Voltage | On Voltage | Off Voltage | Desired Voltage | Off Voltage |

FIG. 8A

| Byte | Array Node Potential | | | | Cell Node Potential | | |
|---|---|---|---|---|---|---|---|
| | PCL | WL | BL | SCL | CG (520) | CD (540) | CS (530) |
| 410-450 | 0 | HV | HV | 0 | 0 | HV | Float |
| | | | 0 | 0 | 0 | 0 | Float |
| 420-450 | 0 | HV | 0 | 0 | 0 | 0 | Float |
| 420-460 | 0 | 0 | 0 | 0 | Float | Float | Float |
| 410-460 | 0 | 0 | HV | 0 | Float | Float | Float |
| | | | 0 | 0 | Float | Float | Float |

FIG. 8B

READ OPERATION

900

| PAGE CONTROL LINE 300 | GATE OF SOURCE CONTROL 390 | SELECTED WORD LINE | NON-SELECTED WORD LINES | SELECTED BIT LINES | NON-SELECTED BIT LINES |
|---|---|---|---|---|---|
| Sense Voltage | On Voltage | Select Voltage | Off Voltage | Read Voltage | High Impedance |

FIG. 9A

| Byte | Array Node Potential | | | | Cell Node Potential | | |
|---|---|---|---|---|---|---|---|
| | PCL | WL | BL | SCL | CG (520) | CD (540) | CS (530) |
| 410-450 | Vsen | Vsel | Vread | Von | Vsen | Vread | 0 |
| 420-450 | Vsen | Vsel | Float | Von | Vsen | Float | 0 |
| 420-460 | Vsen | 0 | Float | Von | Float | Float | 0 |
| 410-460 | Vsen | 0 | Vread | Von | Float | Float | 0 |

FIG. 9B

MEMORY ARRAY AND METHOD OF OPERATING THE SAME

FIELD OF INVENTION

The present invention generally relates to electronic memory devices, and more particularly, to Electrically Erasable and Programmable Memory device and operation methods.

BACKGROUND OF INVENTION

Solid-state nonvolatile memories, such as EEPROMs (electrically erasable programmable read only memories) have been used as storage devices for various applications including communication modules, equipment control systems, and consumer electronics products. Progress of these applications increasingly requires higher memory performance in terms of fast access time, high endurance, low power and high storage density.

Figure 1:
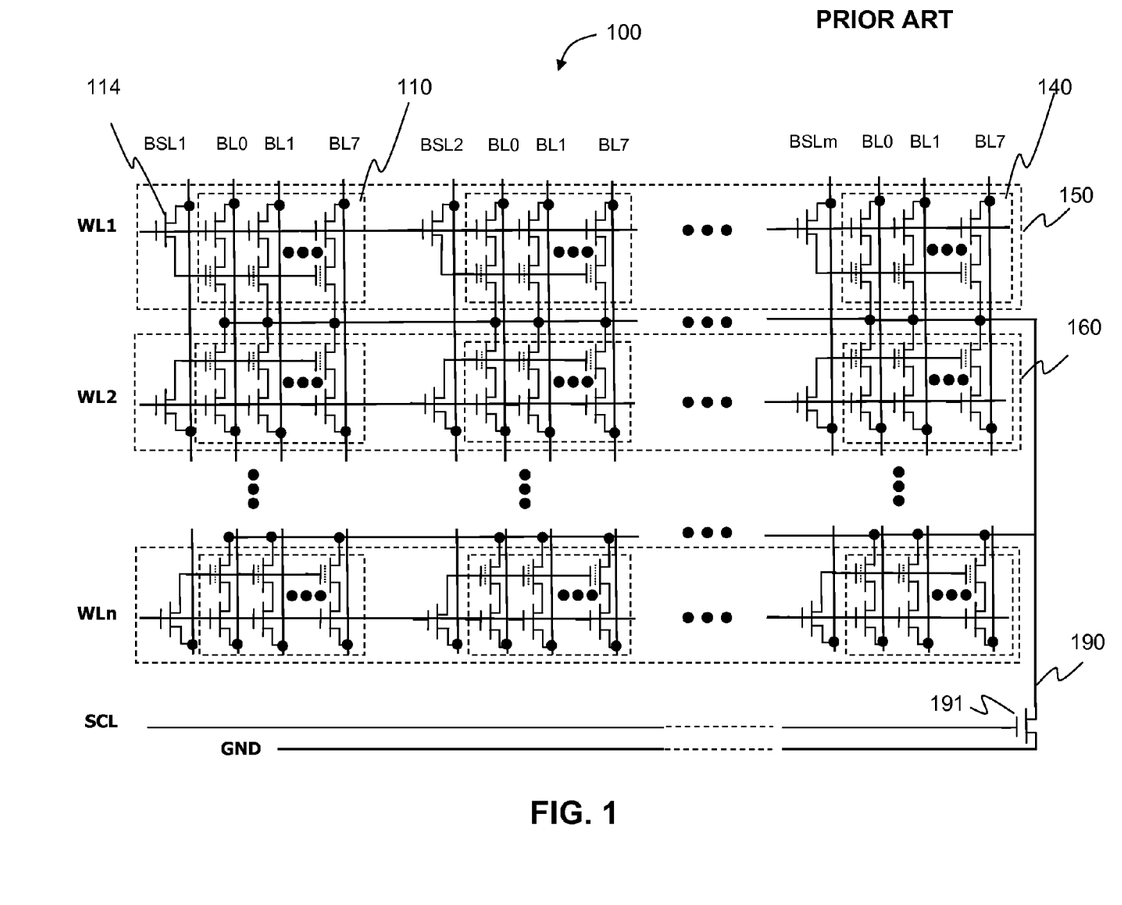
FIG. 1 illustrates a prior art EEPROM memory device.

FIG. 1 illustrates a conventional EEPROM memory device. The memory device 100 has n pages; each page is formed by a row. For example, first row 150 defines first page, second row 160 defines second page, and so on. The memory device 100 has m bytes in each page. For example, first page 150 contains first byte 110 through $m^{th}$ byte 140. Each byte has a number of memory bits. The source terminal of the memory bits are connected to a common line 190 which is coupled to the drain of a source control transistor 191.

In the conventional EEPROM, each byte in the memory device 100 has a dedicated byte select transistor to enable byte accessibility for read, program, and erase operation. For example, transistor 114 is the byte select transistor for byte 110. Therefore the conventional memory device 100 contains n*m memory bytes and n*m byte select transistors.

For a conventional memory device construction such as device 100, dedicated byte select transistors are necessary for byte accessibility. However, these transistors occupy significant silicon estate especially when process technology moves towards smaller pitches. There are endeavors to eliminate the byte select transistors in order to increase array density while having byte accessibility.

U.S. Pat. No. 5,455,790 discloses an EEPROM cell and operation that could realize byte accessibility without byte select transistors. The memory cell is specially constructed to place each byte segment in individually electrically isolated Pwells in N type substrate in order to achieve byte accessibility.

US Patent Application No. 20070140008 discloses another type of EEPROM cell and operation. The cell adopts a special construction that incorporates an integral bit select transistor, which results in a smaller footprint. Again it is built in individually electrically isolated Pwells within a deep Nwell, which is in a P type substrate.

The structure of well isolation, either P-N junction isolation, or dielectric isolation, such as a deep trench, takes a significant extra space and usually involves extra process steps or a change to conventional process integration.

Alternatively, US Patent Application No. 20090279361 discloses a memory configuration to eliminate byte select transistor in an EEPROM array. The byte select transistor is eliminated by separately biasing well and several other control lines to selectively program a byte, word, or page. However, using well bias requires a memory p-well to be isolated from p-substrate, e.g., through a triple well, which modifies conventional process integration and adds process complexity. In its operation, the byte segment source lines, common well line and select lines all need complex biasing scheme in addition to bit lines and word lines, thus adds circuit complexity and memory footprint.

In view of the above problems of byte-addressable EEPROM memory devices, there are needs to improve the density of memory arrays and yet preserve the simplicity and maturity of device structure, memory operation, and manufacturing process.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DETAILED DESCRIPTION OF THE INVENTION

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one ordinary skill in the art and having possession of this disclosure, are to be considered within the scope of the invention.

Figure 2:
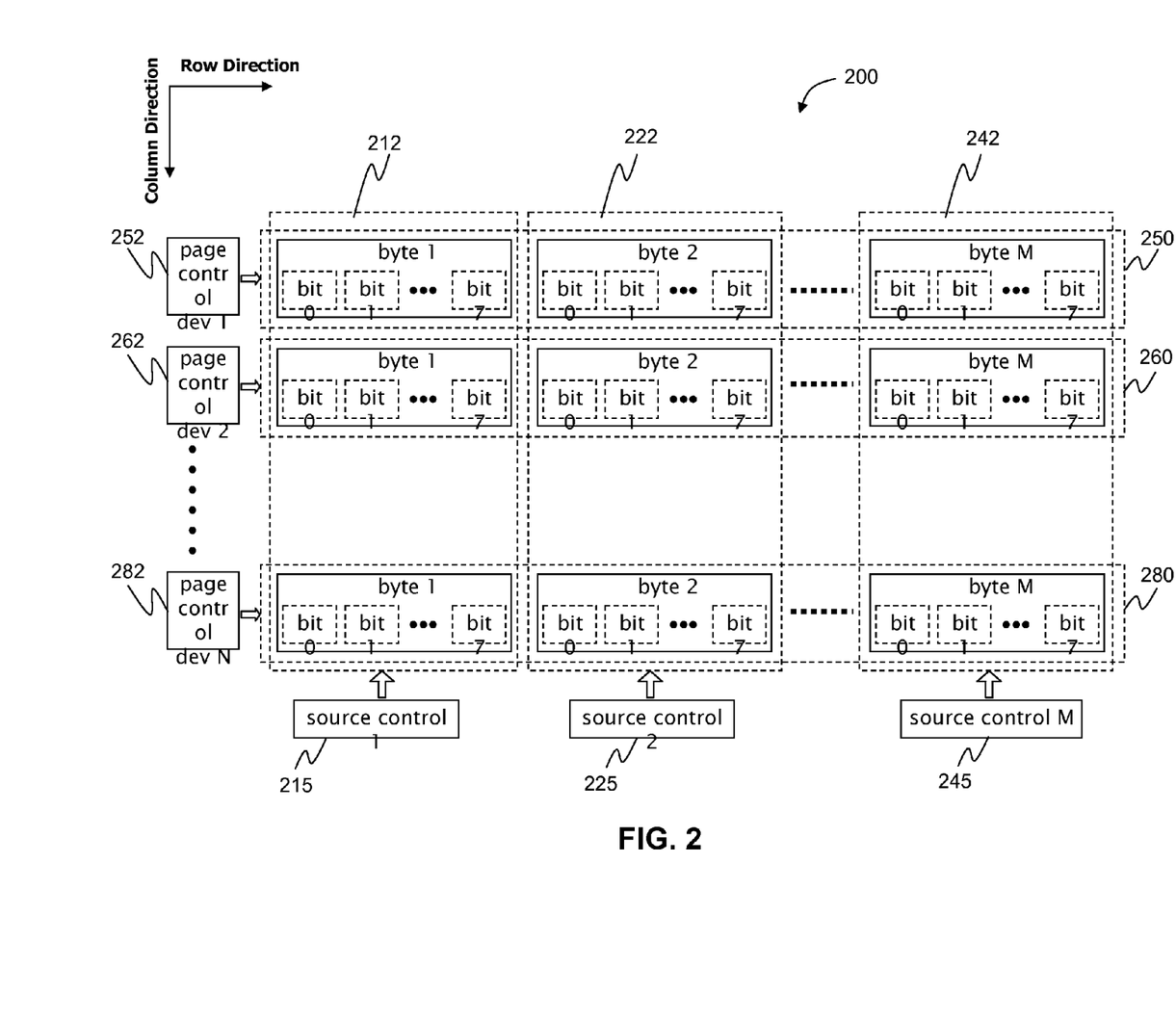
FIG. 2 is a block diagram illustrating an example of a memory device in accordance with one embodiment of the present invention.

FIG. 2 is a block diagram illustrating an example of a non-volatile memory device in accordance with one embodiment of the present invention. Herein, a non-volatile memory device is a device that can retain its data even when its electrical power supply is turned off. Referring to FIG. 2, the non-volatile memory device 200 according to this embodiment includes a plurality of memory cells organized in a matrix of rows and columns. In the row direction, each row is defined as a "page". For example, the first row 250 forms first page and second row 260 forms second page 260, and so on. Each page comprises a plurality of bytes and each byte includes a number of bits. Each bit comprises one memory cell. Although the number of bits in a byte is 8 shown in FIG. 2, it can be other numbers such as 16, 32 or 64.

As shown in FIG. 2, the first column of the memory device 200 comprises a plurality of page control devices; each page control device couples to the memory cells in the same row. For example, page control device 252, 262, and 282 couples to memory cells in first 250, second 260 and $N^{th}$ page 280 respectively.

In the column direction, the memory device 200 is divided by M byte segments. Herein "byte segment" is defined as a group of bytes located on the same column of the memory array. For example, in FIG. 2, byte segment 212, 222, and 242 is defined for the group of bytes resides on the first, second, and $M^{th}$ column respectively.

The last row of the memory device 200 comprises a plurality of source control devices; each source control device couples to the memory cells in the same byte segment. For example, source control device 215, 225, and 245 couples to memory cells in byte segment 212, 222, and 242 respectively.

Figure 3:
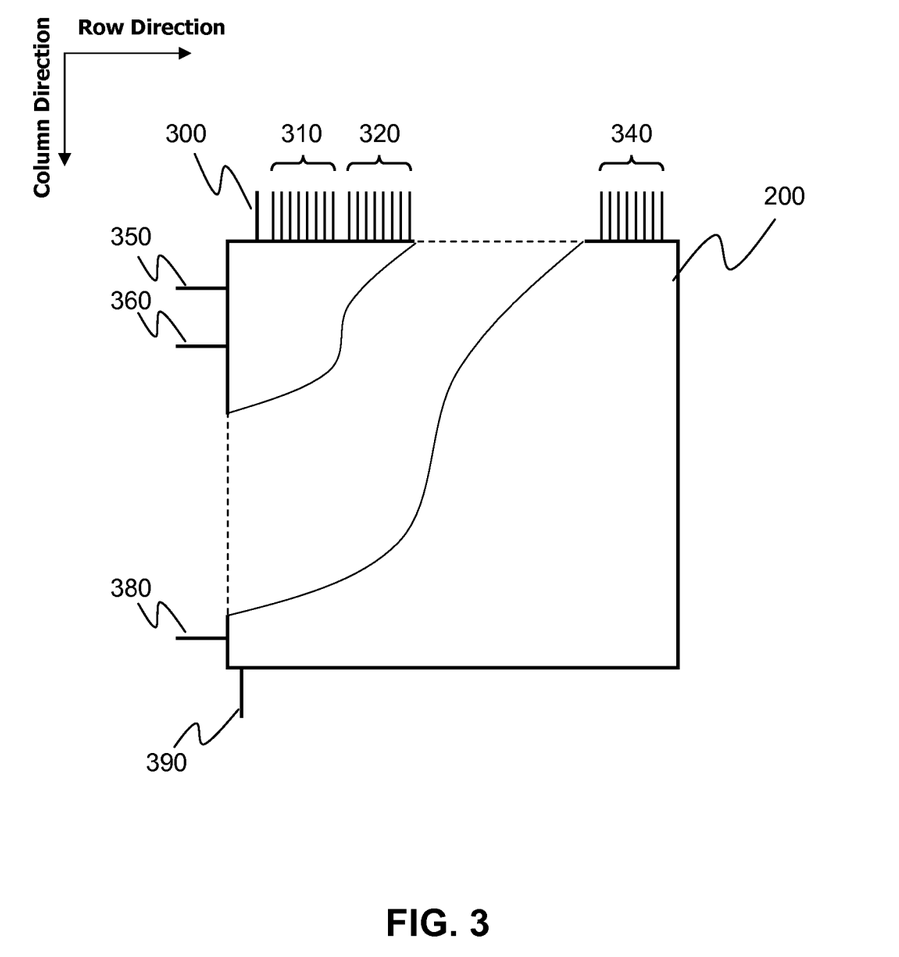
FIG. 3 illustrates an example of external pin arrangement of a memory device shown in FIG. 2.

According to one embodiment of the present invention, an external pin connection arrangement is shown in FIG. 3. In the column direction, there are connection pins corresponding to each byte column of bits. For example, pin 310, 320, and 340 couples to bits in first 212, second 222 and $M^{th}$ 242 byte segment respectively. In addition, there is a pin 300 for page control line which couples to all page control devices 252 through 282 and a pin 390 for source control line couples to all source control devices 215 through 245.

In the row direction, pin 350 through 380 are word lines, each of them couples to a corresponding page control device and memory cells in the same page.

Several advantageous features can be recognized from the structure of the memory device 200 as shown in FIG. 2 and FIG. 3. The memory device 200 does not have an individual byte select transistor for each byte. The total number of elements in the array includes M*N bytes plus N page control devices and M source control devices. Compared with conventional memory device 100, device 200 has a significant reduction of area and therefore increases the density of memory cells. In addition, the number of byte select line control devices (not shown in FIG. 1) in prior art 100 are reduced to only one page control line device (not shown in FIG. 4) in 300. This will help simplify the peripheral control circuit. Furthermore, well biasing or isolation is not required for the configuration of memory device 200 and therefore saves manufacture cost of device fabrication. By reading the FIG. 2 and FIG. 3 in conjunction with the following descriptions and figures, it will be recognized that this device can be operated with byte accessibility by various combinations of voltages applied to the connection pins to erase, program, read a logic state stored in one or more of the memory cells.

Figure 4:
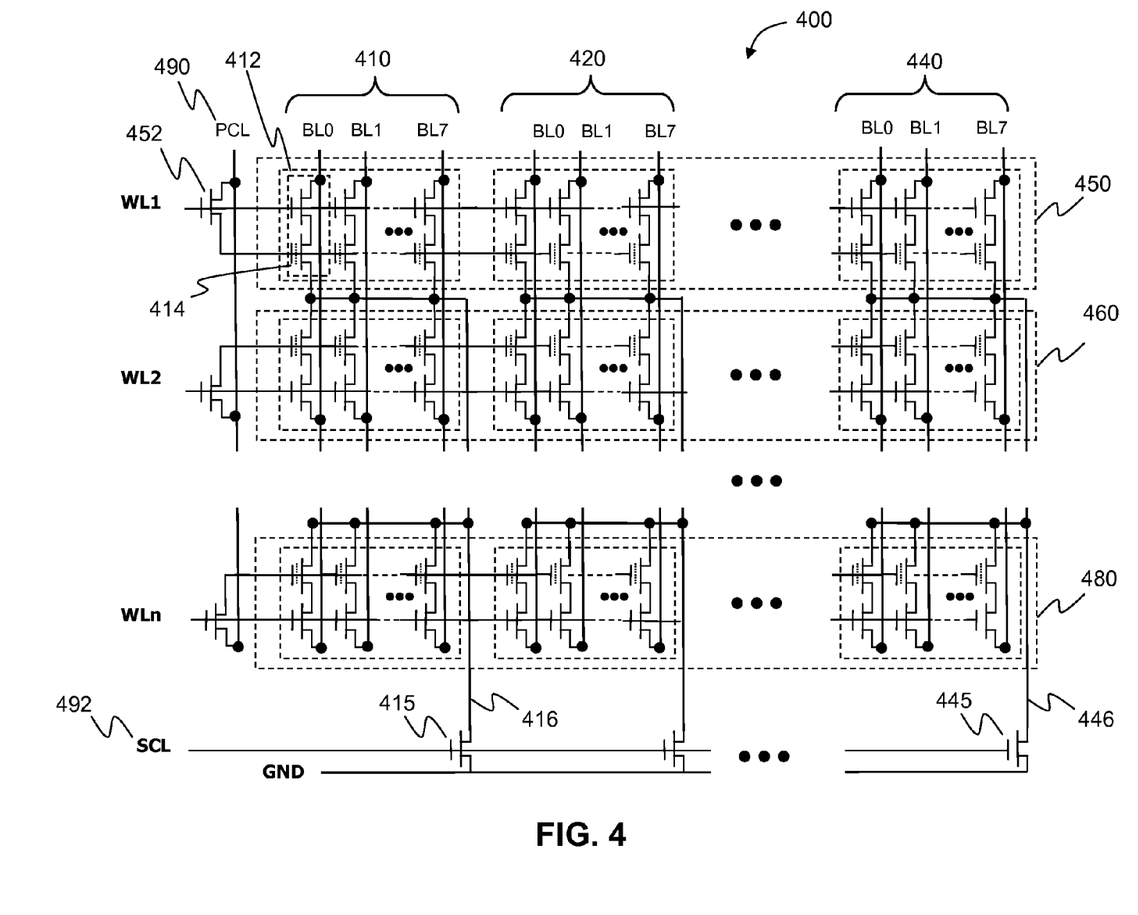
FIG. 4 is a circuit diagram illustrating an example of a memory device in accordance with one embodiment of the present invention.

Referring to FIG. 4, an exemplary circuit diagram of a part of a memory device is illustrated. In accordance with one embodiment of the present invention, a memory device comprises at least one memory array 400 constructed on a semiconductor substrate, such as a p-type silicon wafer. Each memory array 400 comprises a page control line (PCL) 490 and a plurality of pages, such as page 450 through 480, and each said page is arranged in a row comprising a plurality of bytes. As shown in FIG. 4, there are M bytes in each page. Each byte comprises a number of bits and each bit is formed by a memory cell. For example, bit 414 is the first bit in byte 412. Memory array 400 also comprises a plurality of page control transistors as page control devices; each of them corresponds to a page. For example, page control transistor 452 corresponds to page 450. The drain of each page control transistor connects to the page control line 490.

Memory array 400 further comprises a plurality of source control devices, 415 through 445, which are configured to provide either predetermined biases or floating potentials to source lines. The source control devices can be source control transistors. As shown in FIG. 4, each source control transistor corresponds to each byte segment of the array. For example, first source control transistor 415 couples to first byte segment 410 via source line 416. The gate of each source control transistor connects to the source control line (SCL) 492.

Figure 5:
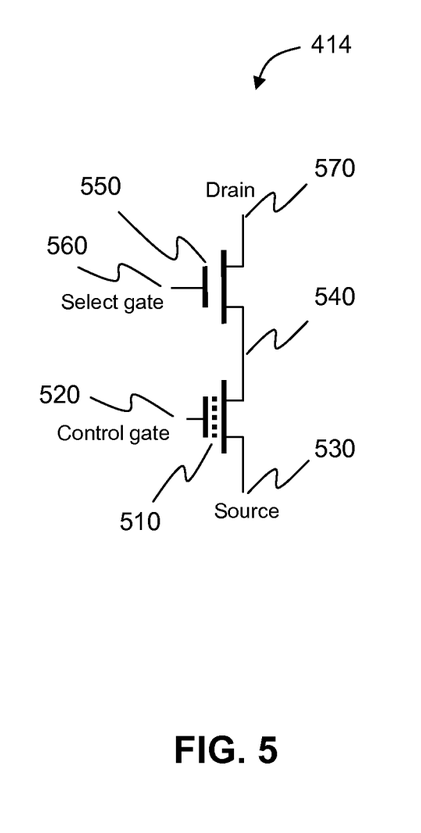
FIG. 5 is a circuit diagram illustrating a memory cell in accordance with one embodiment of the present invention.

In one embodiment, a memory cell is N-channel 2-transistor (2T) floating tunnel oxide (FLOTOX) EEPROM. A typical equivalent circuit of 2T N-channel FLOTOX EEPROM cell is shown in FIG. 5, wherein memory cell 414 comprises a FLOTOX transistor 510 (also referred as memory transistor) connected in serial with a bit select transistor 550. The drain 570 of the bit select transistor connects to a bit line, for example in FIG. 4, bit line BL0 of byte segment 410. The source of bit select transistor connects with the drain of FLOTOX transistor and forms node CD 540. The gate of the bit select transistor (select gate) 560 connects to the gate of the page control transistor, for example, word line WL1. The gate of FLOTOX transistor (control gate, CG) 520 connects to the source of the corresponding page control transistor. The source, CS 530 of the FLOTOX transistor connects to the source line in the same byte segment.

Figure 6A:
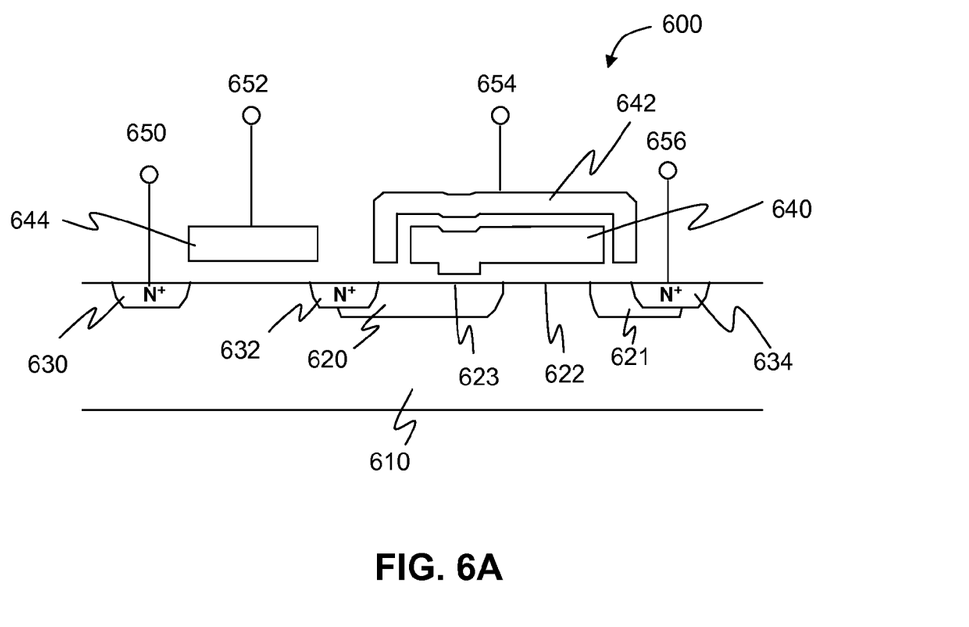
FIG. 6A and FIG. 6B are cross sectional views illustrating structures of memory cells in accordance with embodiments of the present invention.
Figure 6B:
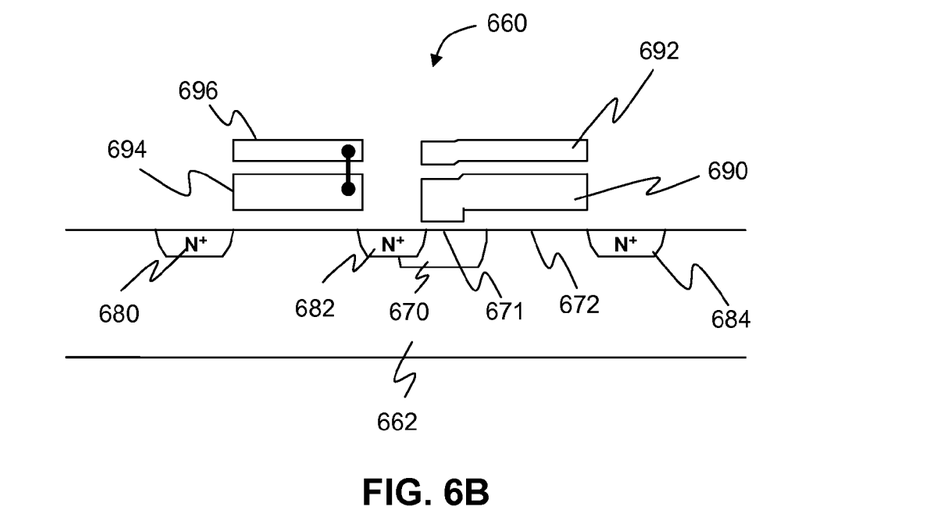

FIG. 6A and FIG. 6B provide examples of 2T N-channel FLOTOX EEPROM cells. FIG. 6A is a cross-section view of memory cell 600 which is constructed within a p-type semiconductor substrate 610 that may be a lightly doped p-type silicon wafer, or a p-type epitaxial layer on a more heavily doped p-type silicon wafer. The memory cell 600 includes four terminals. Terminal 650 is electrically connected to contact region 630 which is heavily doped n+ region for the drain of the bit select transistor. Terminal 650 is for connection to a bit line of a memory array. Terminal 652 is electrically connected to the gate electrode 644 of the bit select transistor. Terminal 652 is for a word line. Terminal 654 is electrically connected to the gate electrode 642 of the memory transistor. The gate electrode 642 is above a floating gate 640. Terminal 656 is electrically connected to a heavily doped n+ region which is the source of the memory transistor. A heavily doped n+ region 632 connects the drain of the memory transistor with the source of the bit select transistor. There are drain and source buried region 620 and 621 which are heavily doped n-type regions extended from contact region 632 and 634 respectively to form cell channel region 622 and tunneling region 623.

FIG. 6B shows another example of 2T N-channel FLOTOX EEPROM cells. As shown in the cross-section view, memory cell 660 is formed within a p-type semiconductor substrate. The memory transistor comprises a floating gate 690 and a control gate 692 which are self-aligned in vertical direction. The select gate of the bit select transistor is formed by self-aligned stacked gate of electrode 694 and electrode 696. Electrodes 694 and 696 are electrically connected together. This stacked gate configuration results in a compact unit cell.

In FIG. 6B, besides three heavily doped n+ regions, 680, 682, and 684 for the drain contact of bit select transistor, CD node, and source contact of the memory transistor, there is a heavily doped n-type buried region 670 extended from n+ region 682 under the floating gate 690 to form tunneling region 671 and channel region 672.

Although two examples of 2T N-channel FLOTOX EEPROM cells are shown in FIG. 6A and FIG. 6B, other structure variations are anticipated in the context of the present invention. In addition, p-channel transistors built in n-type substrates may be used for desired applications.

There are several common features of memory cell 600 and 660 shown in FIG. 6A and FIG. 6B. In both types of the memory cells according to present invention, there are no triple-well structures. Herein the term "triple-well" is a region doped in an opposite polarity as the substrate wherein the transistor channel is built within. The triple-well is used to electrically isolate the memory cell channel from substrate in vertical direction as in some conventional devices. As shown in FIGS. 6A and 6B, the transistor channels are built directly in the substrate, which results in less manufacture steps and reduced fabrication cost. In addition, the memory device shown in FIGS. 6A and 6B do not require horizontally surrounding well isolation between transistors within the substrate which results in manufacture cost reduction and a higher density.

As described in FIG. 2 through FIG. 6 and accompanying forgoing description, the memory devices are constructed highly compact without individual byte select transistor, well isolation, or well biasing. The byte accessibility and functions of the memory devices are realized by the following operation methods according to various embodiments of the present invention.

i) Erase Operation

Referring back to FIG. 5, the erase operation of the memory cell 414 is carried out by accumulating electrons in the floating gate of the memory transistor 510. In order to erase cell 414, an on voltage, typically 12-18 V for n-type transistors for example, is applied between node CG 520 and node CD 540 to create an high electric field needed for electrons to tunnel from the N-buried layer in p-type substrate through the thin layer of tunnel oxide to the floating gate of the memory transistor 510.

Figure 7A:
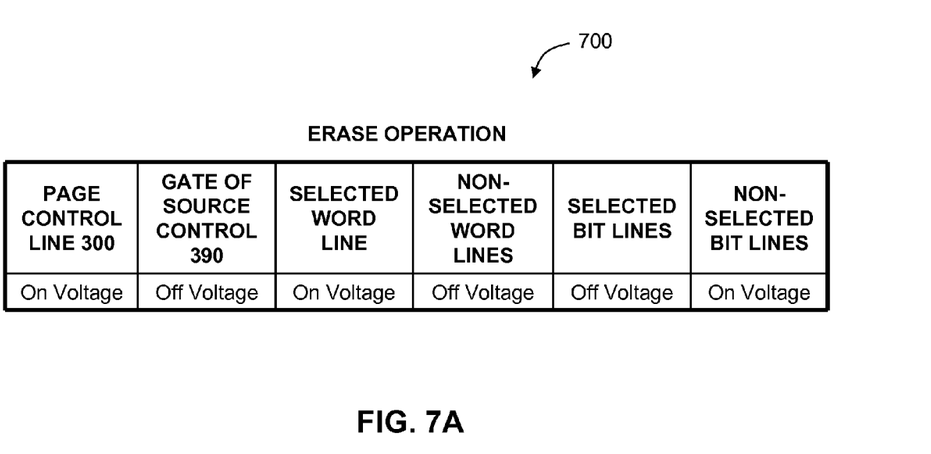
FIG. 7A and FIG. 7B illustrate a method of erase operation of a memory in accordance with one embodiment of the present invention.

FIG. 7A describes a method 700 for erasing selected bytes of the memory array in accordance with one embodiment of the present invention. The method comprises applying on-voltage on the page control line PCL (300 or 490); applying an off-voltage on the gate terminals of all the source control transistors (SCL, 390 or 492) to turn off the source control transistors and establish a floating potential on each source line (416 through 446); applying the on-voltage on the word line of the selected byte which couples to the gate terminals of the page control transistor and all the bit select transistors on the row corresponding to the selected byte; applying off-voltages on the word lines of the non-selected bytes; applying off-voltages on the bit lines corresponding to the selected bytes; and applying the on-voltage on the bit lines corresponding to the non-selected bytes. Herein, the term "the word lines of the non-selected bytes" and "the bit lines corresponding to the non-selected bytes" are referring to the word line or bit line that does not coupled to any selected bytes. For example, if byte 412 in FIG. 4 is selected, word line $W_2$ through Wn are the word lines of the non-selected bytes. Likewise, bit lines 420 through 440 are the bit lines corresponding to the non-selected bytes.

Figure 7B:
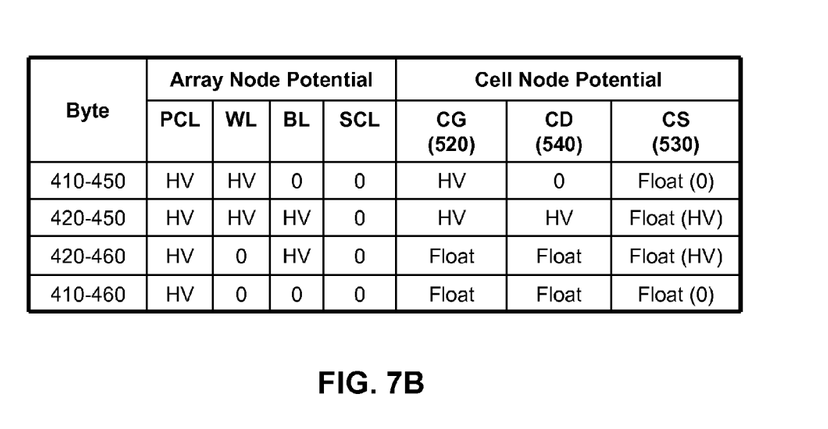

FIG. 7B provides a detailed example of method 700 to erase a selected byte 412, the byte on both page 450 and byte segment 410 as defined in FIG. 4, while maintaining logic states on non-selected bytes. In FIG. 7B, HV is referred as "On Voltage" as defined in FIG. 7A. Zero voltage is referred as "Off Voltage" herein. When an HV is applied to the first word line, WL1 350, all transistors, including page control transistor 452 and bit select transistors of the memory cells in page 450, are turned on. Since HV is also on page control line PCL, the potentials of the control gate, CG, are high for all memory transistors in page 450. As zero voltages are applied to all bit lines in byte segment 410 while bit select transistors in this byte are on, the potentials of CD 540 of memory cells in byte 412 are close to the ground.

According to method 700, an off voltage is applied to the gate of source control transistors, SCL, which turns off all source control transistors 415 through 445. As the result, the potentials of all source lines 416 through 446 are at floating states. For the selected byte 412, since both bit select and memory transistors are on and the bit lines are at ground potential, the potentials of CS are close to the ground. The high voltage on CG and ground potential on CD and CS leads to erasing logic states stored on all bits in selected byte 412.

Referring to FIG. 7B, there are three types of non-selected bytes represented by byte 420-450, 420-460, and 410-460. Byte 420-450 is in the same page as the selected byte 412, but different byte segment. The potential of CG is at HV, same as that of 412. Since the potential on the bit lines of non-selected byte are high (HV) and both bit select and memory transistors are turned on, node CD and the floating node CS are both charged to high potential (HV). As the result, the potential difference between CG and CD is small and the logic states stored on these memory transistors will not be altered.

For non-selected byte in the same byte segment as the selected byte 412, but different pages, such as byte 410-460, the voltage on the word lines are off and the corresponding page control transistors and bit select transistors of the memory cells are off, which set the potential of nodes CG and CD at floating states. There would not be charge transfer between the two floating nodes CG and CD and the stored logic states on the memory transistors will not be changed. Since source nodes of memory cells in the same byte segment are connected together, their CS potentials are the same as that in byte 410-450 at close to the ground potential.

For non-selected byte in different page and different byte segment from the selected byte 412, such as byte 420-460, the voltage on the word lines are off and the corresponding page control transistors and bit select transistors of the memory cells are off, it is in similar situation of byte 410-460 and the stored logic states on these memory transistors will not be changed.

As shown in FIG. 7B, byte 410-450 is the only one that the potential difference between node CG and CD is high and stored logic state can be changed. The potential differences between CG and CD for other bytes are small and will not affect the charges stored in these memory cells. Therefore, applying method 700 will erase and only erase selected bytes.

The erasing method 700 can be applied to erase a group of bytes in a page or to all bytes in a page by setting selected bit lines to ground and non-selected bit lines to HV. Therefore, in one operation, memory cells in multiple bytes or entire page can be erased.

ii) Program Operation

Figure 8A:
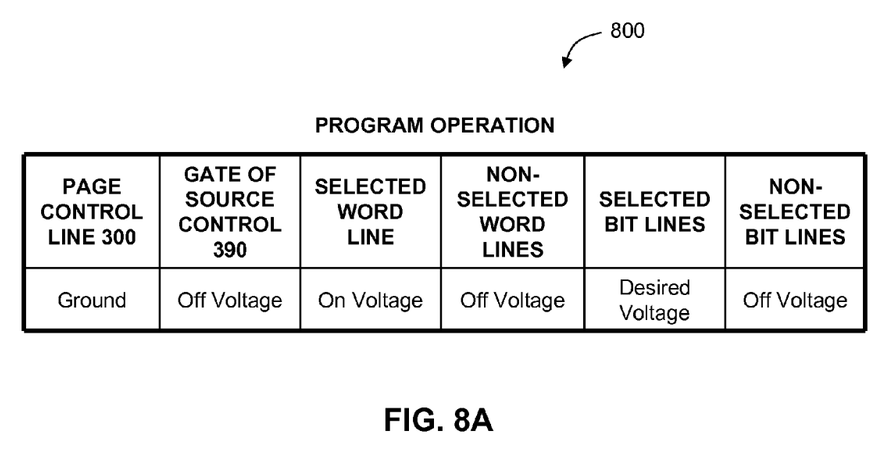
FIG. 8A and FIG. 8B illustrate a method of program operation of a memory in accordance with one embodiment of the present invention.

FIG. 8A shows a method 800 for programming selected bytes of the memory array in accordance with one embodiment of the present invention. The method comprises applying a ground potential on the page control line; applying an off-voltage on the gate terminals of all the source control transistors to turn off the source control transistors and establish a floating potential on each source line; applying an on-voltage on the word line corresponding to the selected bytes; applying off-voltages on the rest word lines corresponding to the non-selected pages; applying desired data voltages on the bit lines corresponding to the selected bytes; and applying off-voltages on the rest bit lines corresponding to the non-selected bytes.

Figure 8B:
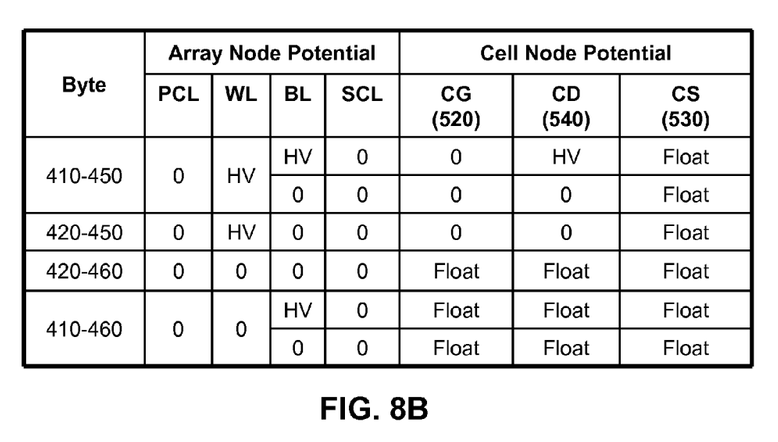

FIG. 8B describes the cell internal node potentials when method 800 is applied to program a selected byte 410-450. When PCL is at the ground potential while the word line is at HV, node CG is at the ground potential. When a bit line of 410-450 is at HV, the node CD is at HV. Therefore a high potential difference between CD and CG is established to attract electrons from floating gate through tunneling region to n-buried node. The potential differences between CG and CD in non-selected bytes, such as 420-450, 420-460, and 410-460, are small enough that will not affect the stored charges in these memory cells.

The programming method 800 can be applied to a group of bytes in a page or to all bytes in a page by setting selected bit lines to desired data voltages and non-selected bit lines to zero. The method 800 enables programming multiple bytes or entire page in one operation.

iii) Read Operation

Figure 9A:
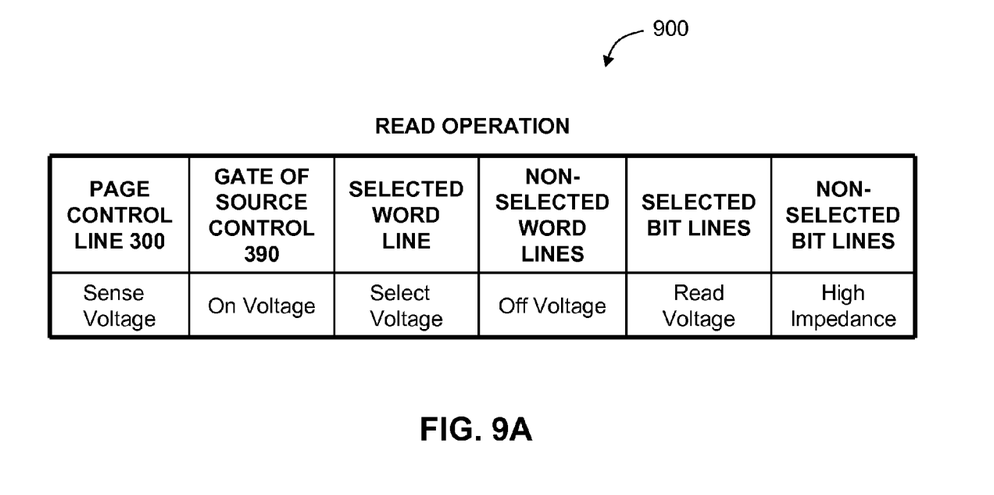
FIG. 9A and FIG. 9B illustrate a method of read operation of a memory in accordance with one embodiment of the present invention.

FIG. 9A describes a method 900 for reading selected bytes of the memory array in accordance with one embodiment of the present invention. The method comprises applying a sense voltage on the page control line; applying an on-voltage on the gate terminals of all the source control transistors to establish the ground potential on all the source lines; applying a select voltage on the word line corresponding to the selected bytes; applying off-voltages on the rest word lines corresponding to the non-selected pages; applying read voltages on the bit lines corresponding to the selected bytes; and establishing high impedance states on the bit lines corresponding to the non-selected bytes.

Figure 9B:
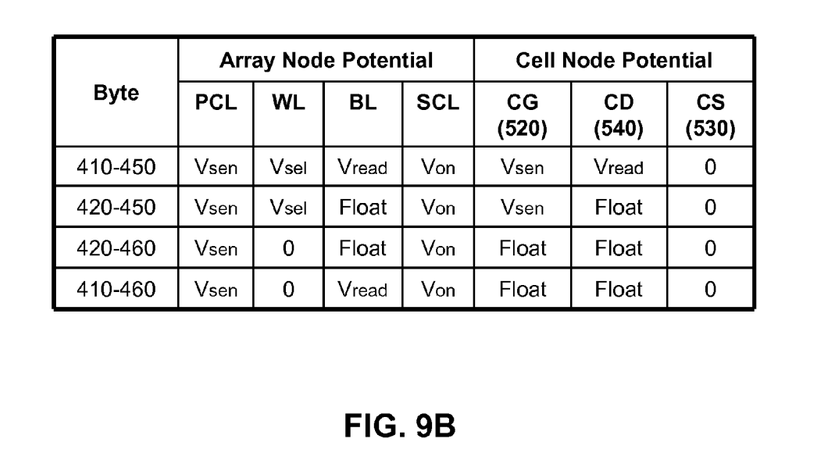

A detailed example of reading method 900 is shown in FIG. 9B. To read a selected byte 410-450, source control line SCL is biased at a potential sufficiently high to turn on the source control transistors. A sense voltage ($V_{sense}$), between 0V to 3V for example, is applied to the page control line PCL. The corresponding word line, WL1, is biased at a potential, $V_{sel}$, that is equal or greater than $V_{sense}$ but substantially lower than HV. The selected bit line is biased at a potential $V_{read}$, between 1V to 4V for example, resulting in a cell current which is read out by a sense amplifier.

For non-selected bytes in different pages from 410-450, such as byte 420-460 and 410-460, the corresponding word lines are biased at the ground potential and the bit select transistors in these memory cells are off. No cell currents are provided from these bytes. For non-selected bytes in the same page as 410-450 but in different byte segment, such as byte 420-450, the bit lines are set to high impedance states and no cell current are read out.

One can recognize that read operation method 900 can be applied to a number of memory bits fewer than a byte or to a number of bytes depending on desired application.

Changes may be made in the above methods, device structures without departing from the scope thereof. For example, in the above embodiments, p-type transistors instead of n-type transistors may be used to construct the memory devices. Accordingly, operation methods 700, 800, and 900 will be altered. It should thus be noted that the matter contained in the above description and/or shown in the accompanying drawings should be interpreted as illustrative and not in a limiting sense. Accordingly, the invention is intended to embrace all other such alternatives, modifications, and variations that fall within the spirit and scope of the appended claims.

What is claimed is:

1. A memory device comprising: at least one memory array on a semiconductor substrate; each said memory array comprises a page control line, a plurality of page control transistors, a plurality of word lines, a plurality of bit lines, and a plurality of pages, each said page is arranged in a row comprising a plurality of bytes which couple to a page control transistor of the plurality of page control transistors with its drain terminal connected to the page control line and with its gate connected to the word line; each said byte includes at least one memory cell;

said memory array further comprises a plurality of source control devices and source lines, said source control devices are configured to provide either predetermined biases or floating potentials to source lines, each said source line couples to all the bytes on the same byte segment of the memory array;

wherein, said memory cell comprises a memory transistor and a bit select transistor without well bias; the source terminal of the memory transistor connects to the source line on the same byte segment, the gate terminal of the memory transistor connects to the source terminal of the page control transistor on the same row, and the drain terminal of the memory transistor connects to the source terminal of the bit select transistor in the memory cell; the gate terminal of the bit select transistor connects to the gate terminal of the page control transistor on the same row and the word line, and the drain terminal of the bit select transistor connects to a bit line which couples to all the memory cells on the same column of the memory array.

2. The memory device of claim 1, wherein the source control device comprises a transistor with its drain terminal connected to the source line on the same byte segment, its source connected to the ground, and its gate connected to source control line.

3. The memory device of claim 1, wherein the semiconductor substrate is p-type.

4. The memory device of claim 1, wherein the memory transistor is an n-channel floating gate tunneling oxide transistor.

5. The memory device of claim 1, wherein the bit select transistor has a vertically stacked double gate electrode.

6. The memory device of claim 1, wherein the page control transistors, memory transistors and bit select transistors are all n-type transistors.

7. The memory device of claim 1, wherein the predetermined bias is substantially proximate to the ground.

8. The memory device of claim 1, wherein the number of the memory cells of the byte is 8.

9. A method of erasing selected bytes of the memory device of claim 2, comprising:
selecting at least one byte in a page;
applying an on-voltage on the page control line;
applying an off-voltage on the source control line to turn off the source control transistors and establish a floating potential on each source line;
applying the on-voltage on the gate terminals of the page control transistor and all the bit select transistors on the row corresponding to the selected bytes;
applying off-voltages on the gate terminals of the page control transistors and all the bit select transistors of the rows corresponding to the non-selected pages;
applying off-voltages on the bit lines corresponding to the selected bytes;
applying the on-voltage on the bit lines corresponding to the non-selected bytes.

10. A method of programming selected bytes of the memory device of claim 2, comprising:
selecting at least one byte in a page;
applying a ground potential on the page control line;
applying an off-voltage on the source control line to turn off the source control transistors and establish a floating potential on each source line;

applying an on-voltage on the gate terminals of the page control transistor and all the bit select transistors on the row corresponding to the selected bytes;

applying off-voltages on the gate terminals of the page control transistors and all the bit select transistors of the rows corresponding to the non-selected pages;

applying desired data voltages on the bit lines corresponding to the selected bytes;

applying off-voltages on the bit lines corresponding to the non-selected bytes.

11. A method of reading selected bytes of the memory device of claim 2, comprising:

selecting at least one byte in a page;

applying a sense voltage on the page control line;

applying an on-voltage on the source control line to establish the ground potential on all the source lines;

applying a select voltage on the gate terminals of the page control transistor and all the bit select transistors on the row corresponding to the selected bytes;

applying off-voltages on the gate terminals of the page control transistors and all the bit select transistors of the rows corresponding to the non-selected pages;

applying read voltages on the bit lines corresponding to the selected bytes;

establishing high impedance states on the bit lines corresponding to the non-selected bytes.

* * * * *